Figure 1:
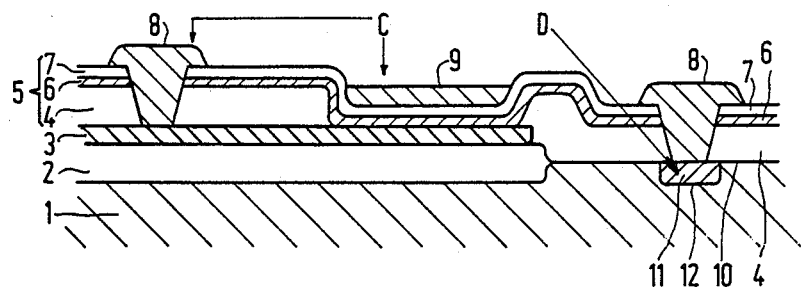

United States Patent [19]

Josquin et al.

[11] Patent Number: 4,897,707

[45] Date of Patent: Jan. 30, 1990

[54] SEMICONDUCTOR DEVICE COMPRISING A CAPACITOR AND A BURIED PASSIVATION LAYER

[75] Inventors: Wilhelmus J. M. J. Josquin, Eindhoven; Henderikus Lindeman, Nijmegen, both of Netherlands

[73] Assignee: U.S. Philips Corporation, New York, N.Y.

[21] Appl. No.: 203,675

[22] Filed: Jun. 7, 1988

[30] Foreign Application Priority Data

Jun. 11, 1987 [NL]  Netherlands ........................ 8701357

[51] Int. Cl.⁴ ............................................ H01L 27/02
[52] U.S. Cl. ...................................... 357/51; 357/59; 357/54; 357/13; 357/40
[58] Field of Search ............... 357/51, 54, 59 G, 59 F, 357/23.6, 40, 13

[56] References Cited

U.S. PATENT DOCUMENTS

| | | | |
|---|---|---|---|
| 4,377,029 | 3/1983 | Ozawa | 357/51 X |
| 4,399,417 | 8/1983 | Ballantyne et al. | 357/51 X |
| 4,466,177 | 8/1984 | Chao | 357/51 X |
| 4,485,393 | 11/1984 | Kumamaru et al. | 357/51 X |
| 4,542,400 | 9/1985 | Hiraki et al. | 357/54 |
| 4,569,122 | 2/1986 | Chan | 357/51 X |

FOREIGN PATENT DOCUMENTS 53-74384  7/1978  Japan ........................ 357/54 A

OTHER PUBLICATIONS

Dunsé et al., "Producing Stabilizing Layers by Converting $Si_3N_4$ Into Phosphosilicate Glass During the Manufacture of MOS Devices," *IBM Technical Disclosure Bulletin,* vol. 18, No. 7, Dec. 1975, p. 2189.
Schlacter et al., "Advantages or Vapor-Plated Phosphosilicate Films in Large-Scale Integrated Circuit Arrays," *IEEE Transactions on Electron Devices,* vol. ED-17, No. 12, Dec. 1970, pp. 1077-1083.

*Primary Examiner*—William Mintel
*Attorney, Agent, or Firm*—Paul R. Miller

[57] ABSTRACT

A semiconductor device comprising a buried phosphor glass layer (5) consisting of a subjacent thick electrically insulating layer (4), a phosphor glass layer (6) and an overlying thin covering layer (7). According to the invention, the thicker electrically insulating layer (4) is locally removed and the combination of phosphor glass layer 6 and covering layer 7 is used as a dielectric for a capacitor. The invention also relates to a method of manufacturing a capacitor with indicated dielectric.

8 Claims, 1 Drawing Sheet

SEMICONDUCTOR DEVICE COMPRISING A CAPACITOR AND A BURIED PASSIVATION LAYER

The invention relates to a semiconductor device comprising a semiconductor body having at least one semiconductor circuit element, a surface of the semiconductor body being coated with a passivation layer consisting of a silicon oxide layer, a phosphor glass layer disposed thereon and an electrically insulating covering layer disposed thereon and having a considerably smaller thickness than the silicon oxide layer.

Such a semiconductor device is known from U.S. Pat. No. 3,615,941.

Electrical properties of semiconductor circuit elements, such as breakdown voltage and noise characteristic, can be markedly improved if the surface of these elements is covered by a passivation layer. This layer reduces the surface recombination that may occur due to surface states and electrical charge that may be mobile.

The electrical properties are already considerably improved by providing a silicon oxide layer.

However, the silicon oxide layer often contains ions, which result in that recombination with charge carriers from the semiconductor body nevertheless occurs.

It is further known that by vitrification of a layer of phosphoropentoxide disposed on the silicon oxide layer the aforementioned effect of recombination in the silicon oxide layer is counteracted. The phosphorosilicate glass layer (PSG) formed by heating has immobilized part of the ions originating from the silicon oxide layer (the so-called "getter anneal effect").

The phosphor content in the PSG layer is then generally low. A higher phosphor content leads to a better passivation of the element, it is true, but it also leads to a poorer adhesion of photoresist used in subsequent etching processes.

In order that a passivation layer having a high phosphor content can nevertheless be used, this phosphor glass layer should be enclosed, in order to avoid the aforementioned disadvantages, between layers which do not contain phosphor and consist, for example, of silicon oxide or silicon nitride. U.S. Pat. No. 3,615,941 discloses such a device, in which a phosphor glass layer is enclosed between a subjacent silicon oxide layer and a thinner overlying covering layer, also of silicon oxide.

The use of a thin covering layer for enclosing the highly doped phosphor glass layer means an additional processing step and consequently in principle a more complicated method. However, this disadvantage would be eliminated if the additional covering layer could be used at the same time to form semiconductor circuit elements to be provided in the semiconductor circuit.

The invention has for its object to use the phosphor glass layer with the thin covering layer disposed thereon also as the dielectric of one or more capacitors forming part of the circuit.

The invention is based on the recognition of the fact that it is possible to form the local interruption of the enclosure of the phosphor glass layer required for this purpose in such a manner that the highly doped phosphor glass layer does not give rise to electrical and/or technological limitations.

According to the invention, a semiconductor device of the kind mentioned in the opening paragraph is characterized in that the device has a silicon layer disposed on an electrically insulating layer and in that the phosphor glass layer with the covering layer is provided at least on part of the silicon layer, while a metal layer is provided on the covering layer with, the silicon layer and the & metal layer constituting the plates and the phosphor glass layer with the covering layer constituting the dielectric of a capacitor.

The phosphorus, which is deposited in the usual manner on an insulating silicon oxide layer, is provided at the area of the capacitor to be formed on a silicon layer, which is insulated from the subjacent semiconductor body. The high phosphorus doping in this case does not give rise to problems for the circuit because the silicon layer is used as a (conductive) plate of the capacitor.

The phosphor glass, which can be etched away only with difficulty in connection with the adhesion of photoresist and is therefore present throughout the semiconductor device, has still another object: to render the layer more strongly conducting.

A first preferred embodiment of the semiconductor device according to the invention is characterized in that the semiconductor body consists of silicon and in that the electrically insulating layer is a silicon oxide layer obtained by local oxidation and sunken at least in part in the silicon (LOCOS).

It is achieved by the measure according to the invention that the said silicon layer strongly doped by the phosphorus is satisfactorily electrically insulated from the semiconductor body.

A second preferred embodiment of the semiconductor device according to the invention is characterized in that the silicon oxide layer has a thickness of 250–750 nm and the covering layer has a thickness of 25–100 nm.

It is achieved by this measure that the silicon oxide layer is sufficiently thick to in order electrically insulate the wiring and to insulate the phosphorus from the semiconductor body, and in that the covering layer is sufficiently thin to be an effective dielectric for a capacitor.

The invention will now be described more fully with reference to an embodiment and the drawing, in which:

FIG. 1 shows diagrammatically in cross-section a part of a semiconductor device according to the invention, and FIGS. 2 to 5 show diagrammatically in cross-section successive stages of manufacture of the semiconductor device shown in FIG. 1.

The Figures are purely schematic and are not drawn to scale. For the sake of clarity, more particularly the dimensions in the direction of thickness are greatly exaggerated.

Corresponding parts in the Figures are generally designated by like reference numerals. In the cross-sections, semiconductor regions of the same conductivity type are generally cross-hatched in the same direction.

FIG. 1 shows diagrammatically in cross-section a part of a semiconductor device according to the invention. The device has a semiconductor body 1 comprising at least one semiconductor circuit element, in this embodiment at least one diode D. The semiconductor body in this embodiment consists of a substrate of silicon of the p-conductivity type having a doping of $10^{15}$ atoms/cm$^3$ and a thickness of, for example, 500 $\mu$m, in which a zone 11 of the opposite conductivity type is formed, which forms with the substrate 1 the planar pn-junction 12 of the diode D. A surface 10 of the substrate is coated with a passivation layer 5 consisting of a silicon oxide layer 4, in this embodiment having a thickness of 400 nm, a phosphor glass layer 6 disposed thereon and an electrically insulating covering layer 7 disposed thereon and consisting in this case of silicon oxide having a considerably smaller thickness than the silicon oxide layer 4, for example a thickness of 75 nm. The phosphor glass layer 6 having a thickness of about 25 nm has a high phosphorus content, in this example of about $10^{21}$ at/cm$_3$. Since, as already stated, such a highly doped phosphor glass layer may give rise to technological and electrical problems, the covering layer 7 is provided.

According to the invention, the device comprises a silicon layer 3 disposed on an electrically insulating layer 2. The insulating layer 2 in this embodiment is a silicon oxide layer, which is obtained by local oxidation of the semiconductor body 1.

The phosphor glass layer 6 is formed with the covering layer 7 on at least a part of the silicon layer 3. Further, a metal layer 9 is formed on the covering layer 7, and metal contacts 8 are provided in contact to silicon layer 3 and diode D. The silicon layer 3 and the metal layer 9 constitute the plates and the phosphor glass layer 6 with the covering layer 7 constitutes the dielectric of a capacitor C (cf. FIG. 1). Due to the fact that the silicon layer 3 is insulated from the semiconductor body 1 by the oxide layer 2, the enclosure of the highly doped phosphor glass layer 6 can be obviated without any risk at the area of the capacitor C, while moreover the heating steps to be carried out during the manufacture can contribute to the conductivity of the silicon layer 3 by diffusion of phosphorus atoms from the phosphor glass layer 6. The semiconductor device described according to the invention can be advantageously manufactured in the following manner.

Figure 2:
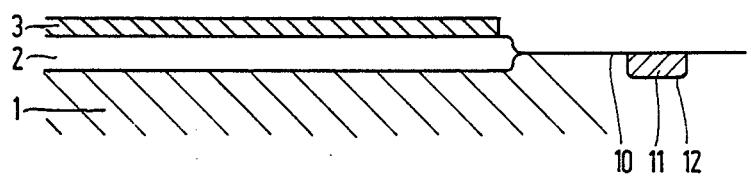
Figure 3:
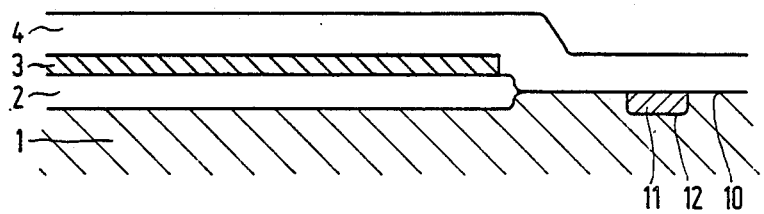

A part of a surface 10 of a semiconductor body 1, in this embodiment of silicon of the p-conductivity type having a doping of $10^{15}$ atoms/cm$^3$ and a thickness of 500 μm, in which a zone 11 of the n-conductivity type is formed, for example by diffusion, is provided in FIG. 2 with an electrically insulating layer 2 consisting in this case of silicon oxide having a thickness of 0.6 μm, which is obtained by selective oxidation of the semiconductor body 1. A silicon layer 3 having in this case a polycrystalline structure is formed on this insulating layer 2 by depositing silicon from the gaseous phase with the use of conventional techniques. The doping of the silicon layer 3 can take place during the deposition of the layer, but also at a later stage by means of diffusion or ion implantation. Subsequently, a silicon oxide layer 4, in this case having a thickness of 0.4 μm, is deposited on the assembly by means of a chemical deposition at low pressure (LPCVD), as seen in FIG. 3, of tetraethoxy silane, this layer 4 being densified by a temperature treatment, in this case at 950° C. for 10 minutes.

Figure 4:
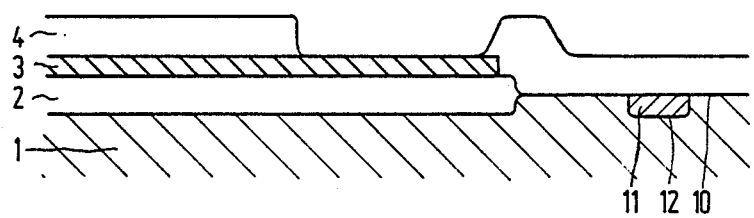

This silicon oxide layer 4 is removed from a part of the surface of the silicon layer 3, in this case by etching, as seen in FIG. 4, whereupon a phosphorus deposition is carried out, for example, by decomposing phosphine at 850° C. for 10 minutes. Thus, a phosphor glass layer 6 is obtained having a high phosphorus content of $10^{21}$ at/cm$^3$.

Figure 5:
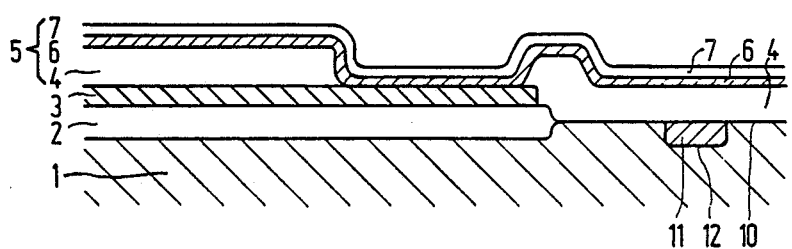

Subsequently, as seen in FIG. 5, the assembly is coated with an electrically insulating covering layer 7 consisting in this embodiment of silicon oxide having a thickness of about 75 nm, which is considerably smaller than that of the silicon oxide layer 4.

Subsequently, a temperature treatment is carried out, in this case at a temperature of 950° C., for removing undesired impurities.

Finally, above the silicon layer 3 a metal layer 9 consisting in this case of Al is provided on the covering layer 7.

Contact holes, through which, for example, the diode D and the capacitor C can be reached, can be etched wet chemically into the passivation layer 5 substantially without under-etching occurring at the area of the phosphor glass layer 6.

It will be appreciated that the invention is not limited to the embodiment described, but that within the scope of the invention many variations are possible for a person skilled in the art. Thus, for example, the layer 4 may be replaced by an insulating layer of another material, for example silicon nitride. The semiconductor body may also consist of a semiconductor material other than silicon, for example of gallium arsenide. Further, the covering layer 7 may also consist of an insulating material other than silicon oxide and instead of or together with the diode D a number of other semiconductor circuit elements forming part of an integrated circuit may be present in the semiconductor body.

What is claimed is:

1. A semiconductor device comprising
  (a) a semiconductor body having at a surface at least one semiconductor circuit element,
  (b) a first electrically insulating layer covering at least a portion of said surface, said first electrically insulating layer being free of said at least one semiconductor circuit element,
  (c) a silicon layer disposed on said first electrically insulating layer,
  (d) a second electrically insulating layer covering said surface and at least a portion of said silicon layer,
  (e) a phosphor glass layer disposed over said silicon layer and said second electrically insulating layer,
  (g) a covering layer of an electrically insulating material disposed on said phosphor glass layer, said covering layer having a substantially smaller thickness than said second electrically insulating layer, and
  (g) at least one metal layer disposed on said covering layer and said phosphor glass layer directly over said silicon layer,
wherein said covering layer and said phosphor glass layer over said silicon layer constitute a dielectric of a capacitor, and said silicon layer and said at least one metal layer constitute electrical plates of said capacitor.

2. A semiconductor device according to claim 1, wherein said semiconductor body is silicon, and wherein said first electrically insulating layer is silicon oxide sunken at least in part into said silicon at said surface.

3. A semiconductor device according to claim 2, wherein said second electrically insulating layer is silicon oxide having a thickness ranging from at least 250 nm to at most 750 nm, and wherein said covering layer has a thickness ranging from at least 25 nm and at most 100 nm.

4. A semiconductor device according to claim 1 wherein said second electrically insulating layer is silicon oxide having a thickness ranging from at least 250 nm to at most 750 nm, and wherein said covering layer has a thickness ranging from at least 25 nm and at most 100 nm.

5. A semiconductor device according to claim 1, wherein said second electrically insulating layer is silicon nitride.

6. A semiconductor device according to claim 1, wherein said semiconductor body is gallium arsenide.

7. A semiconductor device according to claim 1, wherein said at least one semiconductor circuit element includes at least one of a diode and an integrated circuit.

8. A semiconductor device according to claim 1, wherein said metal layer is aluminum.

* * * * *